United States Patent [19]

Nakane et al.

[11] Patent Number: 4,906,930
[45] Date of Patent: Mar. 6, 1990

[54] MAGNETOMETER USING A JOSEPHSON DEVICE AND SUPERCONDUCTING PHOTOTRANSISTOR

[75] Inventors: Hideaki Nakane, Hachioji; Toshikazu Nishino, Kawasaki; Haruhiro Hasegawa, Kokubunji, all of Japan

[73] Assignee: Hitachi, Ltd., Tokyo, Japan

[21] Appl. No.: 153,047

[22] Filed: Feb. 8, 1988

[30] Foreign Application Priority Data

Feb. 27, 1987 [JP] Japan .................. 62-42552

[51] Int. Cl.⁴ .......................... G01R 33/035
[52] U.S. Cl. .................... 324/248; 505/846; 324/96; 455/606
[58] Field of Search ............ 324/248, 301, 302, 303, 324/304, 96, 244; 505/842, 843, 844, 845, 846, 701, 702, 705, 704; 455/606

[56] References Cited

U.S. PATENT DOCUMENTS

| | | | |
|---|---|---|---|
| 3,924,176 | 12/1975 | Fletcher et al. | 324/248 |
| 4,389,612 | 6/1983 | Simmonds et al. | 324/248 |
| 4,489,274 | 12/1984 | Berlincourt | 324/248 |
| 4,567,438 | 1/1986 | Gershenson et al. | 324/248 |
| 4,663,590 | 5/1987 | Gershenson et al. | 324/248 |
| 4,712,065 | 12/1987 | Pitt et al. | 324/244 |

FOREIGN PATENT DOCUMENTS

| | | |
|---|---|---|
| 55-77111 | 6/1980 | Japan . |
| 60-82872 | 5/1985 | Japan . |
| 61-35378 | 2/1986 | Japan . |
| 61-35574 | 2/1986 | Japan . |
| 61-77772 | 4/1986 | Japan . |
| 62-199070 | 9/1987 | Japan . |
| 63-31180 | 2/1988 | Japan . |

Primary Examiner—Gerard R. Strecker
Assistant Examiner—Warren S. Edmonds
Attorney, Agent, or Firm—Antonelli, Terry & Wands

[57] ABSTRACT

A SQUID for detecting a weak magnetic field is constructed of a sensor coil which detects a signal magnetic flux, and a superconducting loop which is magnetically coupled with the sensor coil to generate a periodic voltage corresponding to an interlinking magnetic flux from the sensor coil. The periodic voltage from the SQUID is amplified, and is taken out. The periodic voltage taken out is synchronously detected by a phase-sensitive detecting amplifier. The synchronously-detected signal is converted into a light signal, which is fed back to the SQUID. The light signal fed back is converted into an electric signal by a superconducting phototransistor which is arranged in a cryogenic atmosphere. A magnetic flux corresponding to the electric signal from the superconducting phototransistor is fed back to the superconducting loop by a feedback coil.

1 Claim, 3 Drawing Sheets

MAGNETOMETER USING A JOSEPHSON DEVICE AND SUPERCONDUCTING PHOTOTRANSISTOR

BACKGROUND OF THE INVENTION

1. Field of the Invention

The present invention relates to a magnetometer, and more particularly to a magnetometer using a Josephson device, which is well suited to the detection of a weak magnetic field.

2. Description of the Related Art:

In the technical field concerned, magnetometers using Josephson devices are known as superconducting quantum interference device (hereinafter, referred to as SQUID) magnetometers. The conventional magnetometers are represented by a DC-SQUID magnetometer and an rf-SQUID magnetometer. The DC-SQUID magnetometer is an apparatus wherein a magnetic flux interlinking with a superconducting loop which consists of two Josephson junctions and an inductor is observed in the form of direct current as the change of the maximum superconducting current which flows through the superconducting loop (refer to, for example, U.S. Pat. No. 4,389,612 and U.S. Pat. No. 4,567,438). The rf-SQUID magnetometer is an apparatus wherein a magnetic flux interlinking with a superconducting loop which consists of a single Josephson junction and an inductor is observed in the form of alternating current as the change of the maximum superconducting current which flows through the superconducting loop. In any of the conventional SQUID magnetometers, the SQUID forming the key point thereof is a passive device which senses the magnetic flux interlinking with the superconducting loop. The SQUID using the Josephson junction is immersed in liquid helium, and the output signal thereof is sent through a connecting cable to a measurement circuit as well as a data processor at the room temperature. The SQUID measures a very feeble magnetic flux, and the output signal of the Josephson device is also feeble in itself. Therefore, the signal which is sent from the SQUID to the measurement circuit at the room temperature is a very feeble signal of, for example, about 1 $\mu$V. In consequence, the sensitivities of the conventional SQUID magnetometers have been limited by thermal noise at the room temperature.

Further, a magnetometer for detecting a weak magnetic field is discussed in "IEEE Trans. on Electron Devices," ED27, No. 10 (1980), pp. 1896-1908. In this magnetometer, a voltage signal from a magnetic field detecting device (for example, DC-SQUID) is amplified and is subjected to phase-sensitive detection by a lock-in amplifier, the detection output of which is fed back to the detecting device.

The above prior art does not take into consideration the influence of noise which is applied to a magnetometer circuit or the detecting device through the grounding wire of the circuit. In particular, there has been the problem that, when the magnetometer circuit is operated by an A.C. power source, the magnetometer operates erroneously due to noise from an A.C. power source line.

Magnetometers in each of which, in order to solve such a problem, the magnetic flux detecting device susceptible to noise and the peripheral circuit thereof are connected by photo-isolator means so as to electrically insulate them, are disclosed in the official gazettes of Japanese Patent Applications Laid-open No. 82872/1985, No. 35378/1986 and No. 77772/1986.

These prior-art apparatuses adopt the pulse width modulation (PWM) for converting an electric signal into light. However, they do not take into consideration an influence exerted on the magnetic flux detecting device by pulsed noise developing in a modulator portion of the PWM, that is, the problem of an erroneous operation.

Further, the prior-art magnetometers employ an optical fiber or the like as a feedback circuit and therefore have no problem on the rate of response in that portion. Since, however, electrical elements are respectively connected to an optoelectric converter and an electrooptic converter disposed on both the ends of the optical fiber, there is the problem that the merit of high-speed transfer of the optical fiber is not satisfactorily demonstrated due to the electrical elements.

SUMMARY OF THE INVENTION:

The first object of the present invention is to provide a magnetometer using a Josephson device, in which noise otherwise developing in an electrooptic converter and an optoelectric converter is reduced to prevent erroneous operations.

The second object of the present invention is to provide a magnetometer using a Josephson device, which includes a feedback circuit of high response rate.

The first object mentioned above is accomplished by a magnetometer using a Josephson device, comprising a sensor coil which detects a signal magnetic flux; a superconducting loop which is magnetically coupled with said sensor coil, to generate a periodic voltage corresponding to the interlinking magnetic flux from said sensor coil, and which is formed of an inductor and at least one Josephson junction; means to amplify the periodic voltage from said superconducting loop; synchronously-detection amplifier means to amplify a predetermined frequency component of the periodic voltage amplified by the first mentioned amplifier means; first electrooptic conversion means to convert the signal amplified by said synchronously detecting amplifier means, into a light signal; first light transmission means to transmit the light signal from said first electrooptic conversion means; a superconducting phototransistor which receives the light signal from said first light transmission means and converts it into an electric signal; and a feedback coil which interlinks a magnetic flux corresponding to the electric signal from said superconducting phototransistor, with said superconducting loop; said sensor coil, said superconducting loop and said superconducting phototransistor, which are made with niobium or high-critical temperature oxide-superconductor, being arranged in a cryogenic atmosphere.

An optoelectric converter constructed of the superconducting phototransistor operates in such a manner that the superconducting critical current and the resistance of the device change according to the light input at the cryogenic temperature of 4.2 K in liquid helium. Accordingly, noise to develop in the optoelectric conversion operation becomes only the thermal noise of the device itself and the power distribution resistor at 4.2 K. It is therefore possible to prevent the pulse noise, thermal noise at 300 K and noise from a semiconductor as have developed in the optoelectric converter in the prior art. Moreover, since the function of the magnetometer is not affected by the influences of the noise occurrences, the problem of an erroneous operation is eliminated.

The second object mentioned above is accomplished by a magnetometer using a Josephson device, comprising a sensor coil which detects a signal magnetic flux; a superconducting loop which is magnetically coupled with said sensor coil, to generate a periodic voltage corresponding to the interlinking magnetic flux from said sensor coil, and which is formed of an inductor and at least one Josephson junction; means to amplify the periodic voltage from said superconducting loop; electrooptic conversion means to convert the periodic voltage amplified by the amplification means, into a light signal; synchronous detection means to subject the light signal, per se, from said electrooptic conversion means, to synchronous detection in accordance with a predetermined frequency; second light transmission means to transmit the light signal from said synchronous detection means; a superconducting phototransistor which receives the light signal from said second light transmission means and converts it into an electric signal; and a feedback coil which interlinks a magnetic flux corresponding to the electric signal from said superconducting phototransistor, with said superconducting loop; said sensor coil, said superconducting loop and said superconducting phototransistor being arranged in a cryogenic atmosphere.

Since, in the present invention, the signal processing of the external circuit is entirely executed with the light signals, noise from the external circuit such as power source noise can be prevented. Furthermore, since the feedback operation is executed with the light signal, the response rate becomes remarkably high.

These and other objects and many of the attendant advantages of this invention will be readily appreciated as the same becomes better understood by reference to the following detailed description when considered in connection with the accompanying drawings.

DETAILED DESCRIPTION OF THE PREFERRED EMBODIMENTS

Now, the present invention will be described in detail in conjunction with embodiments.

Embodiment 1

Figure 1:
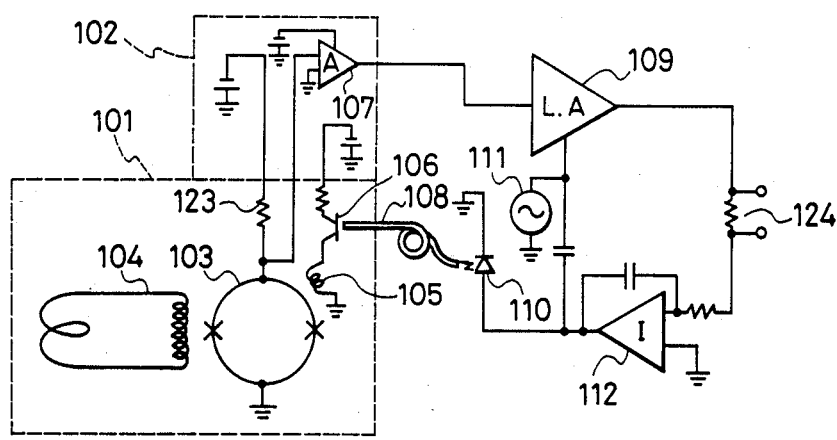
FIG. 1 is a diagram showing an embodiment of the present invention.

This embodiment shown in FIG. 1 is such that the feedback circuit of a magnetometer is connected by a photo-isolator, i.e., optical fiber 108.

In this embodiment, a superconducting phototransistor 106 is employed for an optoelectric converter which is disposed at the low temperature part of the photo-isolator in the feedback circuit. Accordingly, noise to develop in the converter can be reduced, and the erroneous operation of the magnetometer can be prevented. More specifically, the optoelectric converter constructed of the superconducting phototransistor operates in such a manner that the superconducting critical current and the resistance of the device change according to a light input at the cryogenic temperature of 4.2 K in liquid helium. Noise to develop on this occasion becomes only the thermal noise of the device and a power distribution resistor at 4.2 K. Therefore, thermal noise at 300 K, noise from a semiconductor held at 300 K, etc. can be prevented, so that the function of the magnetometer is free from any erroneous operation ascribable to the noise.

Figure 2:
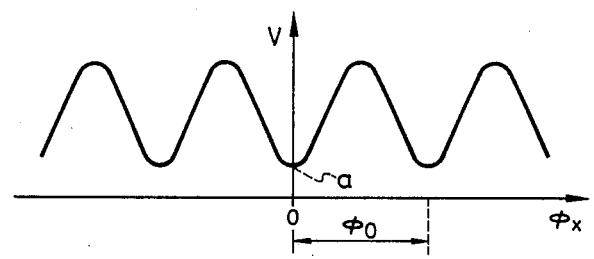
FIG. 2 is a graph showing the relationship between the interlinking magnetic flux and the output voltage of a DC-SQUID.
Figure 5:
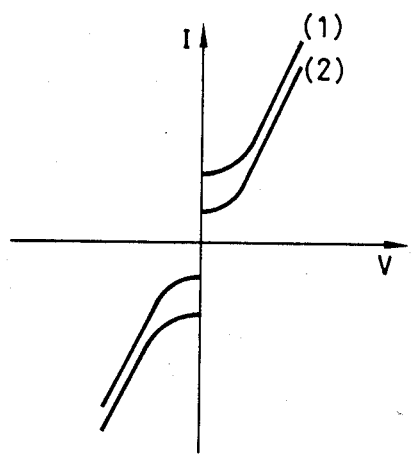
FIG. 5 is a graph showing the voltage - current characteristics of a superconducting phototransistor.
Figure 6:
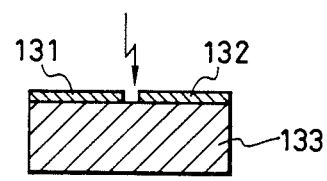
FIG. 6 is a sectional view of the superconducting phototransistor.

As shown in FIG. 1, a sensor coil 104 for detecting a signal magnetic flux and a DC-SQUID 103 are magnetically coupled. The signal magnetic flux interlinking with the sensor coil 104 in a cryogenic atmosphere 101 is input to the DC-SQUID 103. This DC-SQUID 103 is biased to a fixed current by a regulated current source. On this occasion, thermal noise develops also from the power distribution resistor 123. In order to reduce the noise, therefore, the power distribution resistor 123 is also arranged in the cryogenic atmosphere 101. The DC-SQUID 103 biased to the fixed current generates a periodic voltage in correspondence with the interlinking magnetic flux. The period of the periodic voltage becomes a quantized magnetic flux $\Phi_o$ ($2.07 \times 10^{-15}$ Wb). The relationship between the interlinking magnetic flux and the output voltage of the SQUID is illustrated in FIG. 2. The periodic voltage signal is amplified by a battery-driven preamplifier 107, and is delivered to a synchronously-detecting amplifier 109. The synchronously-detecting amplifier 109 amplifies the component of the amplified periodic voltage signal at a frequency f. The synchronously-detecting amplifier 109 is fed with the signal of the frequency f from an oscillator 111. The resulting amplified signal is input to and integrated by an integrator 112. An electrooptic converter 110 constructed of a light emitting diode or a semiconductor laser converts the signal from the integrator 112 into light. The light signal thus obtained is introduced through the optical fiber 108 into the optoelectric converter constructed of the superconducting phototransistor 106 in the cryogenic atmosphere. As shown in FIG. 6, the superconducting phototransistor 106 has a structure in which a source electrode 131 and a drain electrode 132 made of a superconducting material are disposed on the channel of a semiconductor 133. It is a device the source-drain superconducting critical current and the interelectrode resistance of which are changed by projecting light on the channel. FIG. 5 exemplifies the characteristics of the superconducting phototransistor. (1) indicates the characteristic without the light projection, and (2) the characteristic with the light projection. When this device is biased by a proper current, the resistance thereof changes in proportion to the intensity of the projected light, and current to flow therethrough can be controlled. The superconducting phototransistor 106 converts the light signal into an electric signal, to apply the feedback current to a feedback coil 105 and to interlink a resulting magnetic flux with the DC-SQUID 103. In the relationship between the interlinking magnetic flux and the output voltage depicted in FIG. 2, when the external magnetic flux interlinking with the DC-SQUID 103 is null, the magnetic flux $\Phi_x$ remains at a point a in FIG. 2. When the external interlinking magnetic flux exists, the magnetic flux deviates from the point a, and the output voltage increases in this case. Such a change in the output voltage is detected by the synchronously-detecting amplifier 109, and a variation in the output voltage is fed back as the magnetic flux to the DC-SQUID 103 through the electrooptic converter 110 as well as the optoelectric converter 106 and by the feedback coil 105, whereby the deviation from the point a is corrected. In this way, a voltage proportional to the interlinking magnetic flux can be provided across output terminals 124. According to this embodiment, unlike the feedback circuit in the prior art, the sources of noise occurrences are removed from the vicinities of the DC-SQUID 103, and the resistor to act as the source of thermal noise is arranged in the cryogenic atmosphere. These bring forth the effect that the magnetometer can be utilized as a high-sensitivity magnetometer of little noise.

Figure 3:
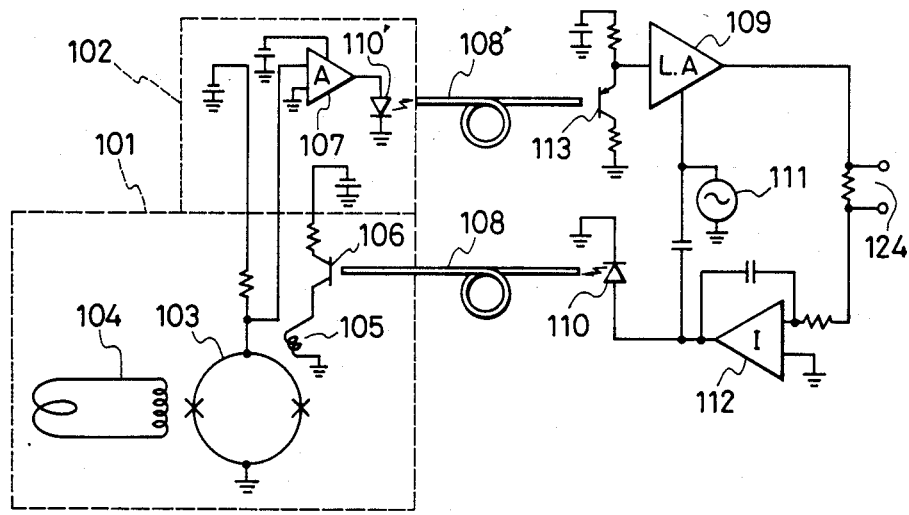
FIGS. 3 and 4 are diagrams each showing another embodiment of the present invention.

FIG. 3 shows a modification to the embodiment of FIG. 1, in which the signal transmission from the preamplifier 107 to the synchronously-detecting amplifier 109 is performed with light as in the feedback circuit. The output of the preamplifier 107 is converted into light by an electrooptic converter 110' constructed of a light emitting diode or a semiconductor laser, and the light is input through an optical fiber 108' to an optoelectric converter 113 constructed of a phototransistor. An electric signal produced by the optoelectric converter 113 is input to the synchronously-detecting amplifier 109. According to the embodiment of FIG. 3, noise from a lead as develops in the case of introducing the output voltage of the DC-SQUID 103 into the synchronously-detecting amplifier 109 by the use of the lead can be eliminated, to bring forth the effect that noise can be more reduced to prevent erroneous operations.

Embodiment 2

Figure 4:
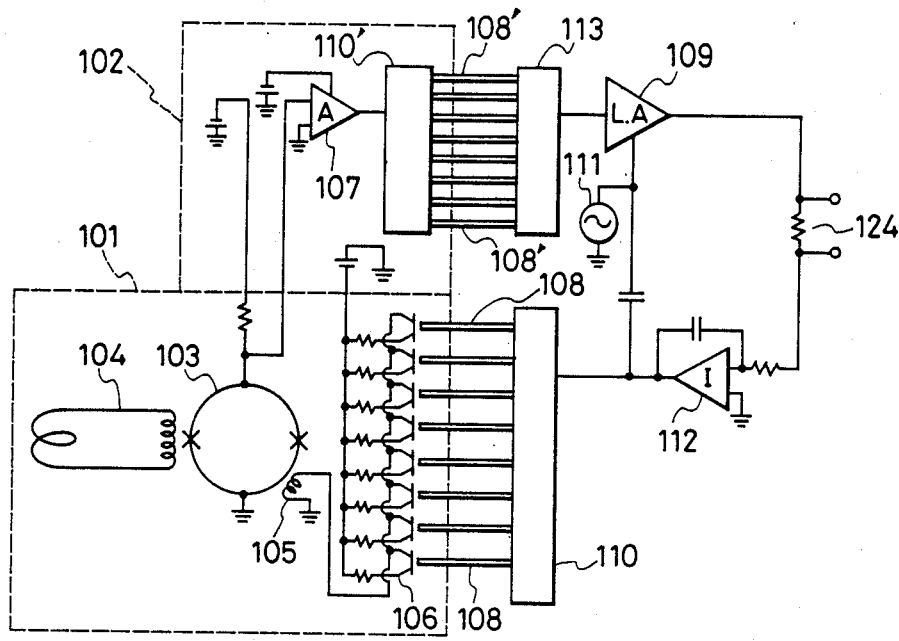

In an embodiment shown in FIG. 4, an electric signal to be converted from an integrator 112 or a preamplifier 107 is converted by an electrooptic converter 110 or 110' into digital light signals, which are transmitted to superconducting phototransistors 106 or an optoelectric converter 113 through optical fibers 108 or 108'. In the setup of FIG. 4, the digital signals are transmitted in parallel. In this case, there are the effects that the transmission at high speed is possible and that the dynamic range is wide. It is similarly allowed to employ digital signal transmission in a serial scheme which uses only one optical fiber 108 or 108'. In particular, since the superconducting phototransistor 106 constitutes the optoelectric converter for generating a feedback current, there is the effect that little noise occurs and that erroneous operations can be prevented.

Also in the case of this embodiment, the connection line of the DC-SQUID 103 with the feedback circuit is made up of the optical fibers, and hence, there is the effect that the amount of conduction heat into a cryogenic vessel can be made less than in case of employing a conductor wiring material.

Embodiment 3

Figure 7:
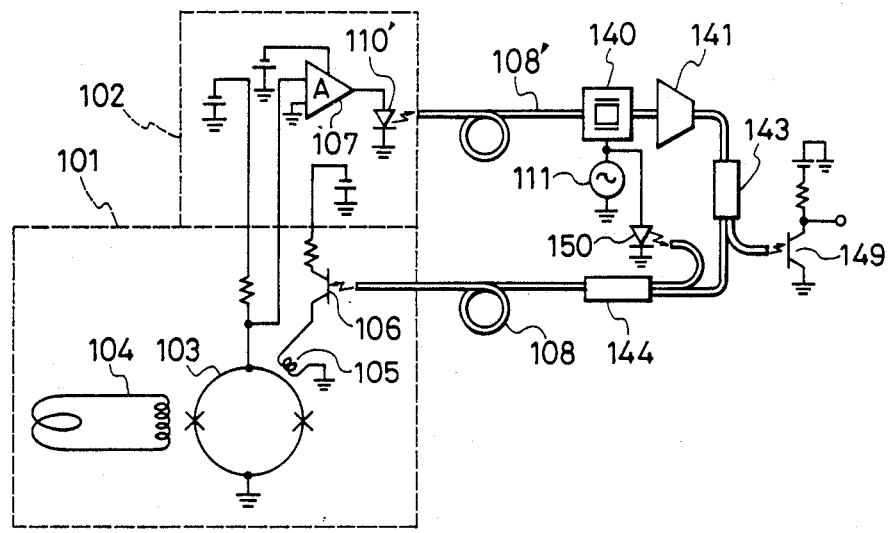
FIGS. 7 and 8 are diagrams each showing still another embodiment of the present invention.

FIG. 7 shows another embodiment of the present invention. In this embodiment, the operation of the feedback circuit of a DC-SQUID is executed with light signals. The output voltage of the DC-SQUID 103 is amplified by a preamplifier 107, and is thereafter converted into a light signal by a light emitting diode or a semiconductor laser 110'. This point is the same as in the embodiment of FIG. 3. The point of difference of this embodiment from the embodiment of FIG. 3 is that the signal processing of an external circuit is entirely based on light signals. More specifically, the light signal led to the external circuit by an optical fiber 108' is input to an optical modulator 140. The optical modulator 140 modulates the light signal in accordance with the signal of an oscillation frequency f from an oscillator 111. The modulated light signal is amplified by a light amplifier 141. This light amplifier 141 is discussed in "1st Opto-Electronic Conference, OEC '86 post deadline papers technical digest, D-11-2 (1986)." The light signal amplified by the light amplifier 141 is delivered to a directional photocoupler 143. Herein, the time constant of the light amplifier 141 is previously set to be sufficiently (one order or more) greater than that of the modulation frequency. Thus, the light amplifier 141 performs an integral operation. Accordingly, the phase-sensitive detection of the light signal can be carried out with the optical modulator 140 and the light amplifier 141. The light signal thus subjected to the phase-sensitive detection and delivered to the direction photo-coupler 143 has a part thereof taken out as an output signal by a phototransistor 149. Further, the remaining part of the light signal is input to a directional photocoupler 144. The oscillator 111 drives a light emitting diode or semiconductor laser 150 so as to generate a light signal at the oscillation frequency f. The directional photo-coupler 144 superposes the light signal from the light emitting device 150 and the light signal from the directional photocoupler 143, and the resulting signal is led through an optical fiber 108 to a superconducting phototransistor 106 held in a cryogenic vessel 101. The subsequent operation in the cryogenic vessel 101 is the same as in the embodiment of FIG. 3.

According to this embodiment, the signal processing in the external circuit is entirely performed with the light signals, so that noise from the external circuit, such as power source noise, can be prevented. Further, the feedback operation is performed with the light signal, so that the response rate can be rendered very high.

Embodiment 4

Figure 8:
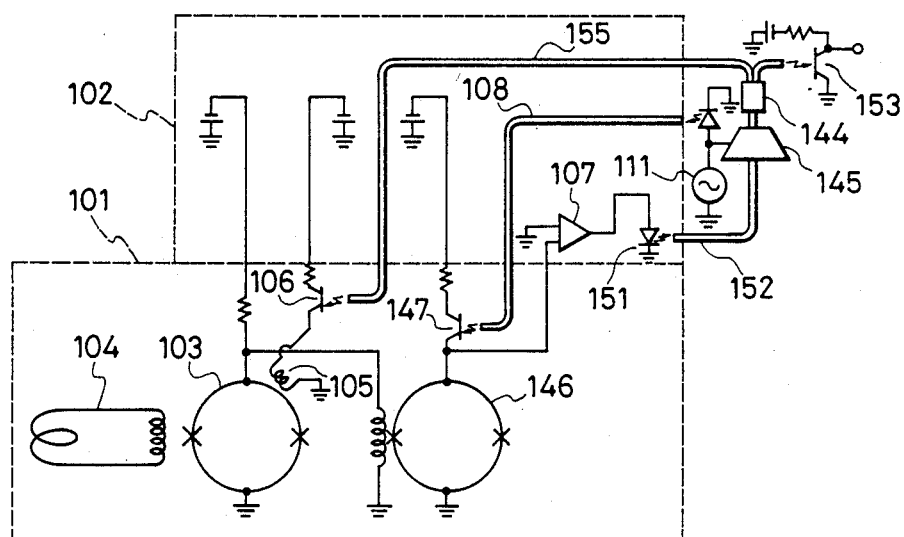

An embodiment in FIG. 8 applies the output signal of a DC-SQUID 103 to an output detecting device 146. This output detecting device 146 is constructed of a superconducting quantum interferometer, and it amplifies the above output signal. A bias current to be fed to the output detecting device 146 is modulated at a frequency from an oscillator 111 by a superconducting phototransistor 147. A superconducting phototransistor 106 is fed with a light signal through an optical fiber 155. Thus, the output of the output detecting device 146 becomes a train of pulses, which are amplified by a preamplifier 107. Since, in this manner, the output of the DC-SQUID 103 is amplified by the output detecting device 146 constructed of the same superconducting quantum interferometer, the signal-to-noise ratio is enhanced. The amplified output of the preamplifier 107 is converted into a light signal by a light emitting device 151 such as light emitting diode or semiconductor laser. Thereafer, the light signal is led out and applied to a light amplifier 145 by an optical fiber 152. The light amplifier 145 is fed with a supply voltage from the oscillator 111, and is therefore synchronous with the oscillator 111. For this reason, it operates as the synchronous detector 140 in FIG. 7. A part of the output of the light amplifier 145 is diverted by a directional photocoupler 144, and is taken out as an electric signal by a photodetector 153. The remaining part of the light signal is led to the superconducting transistor 106 in a cryogenic vessel 101 by the optical fiber 155. The superconducting phototransistor 106 converts the led light into an electric signal, and supplies the latter to a feedback coil 105. The feedback coil 105 feeds the electric signal of the superconducting phototransistor 106 back to the DC-SQUID 103 as a magnetic flux. The feedback operation is carried out as thus far described. In this way, the light signal is directly fed back, so that the response rate becomes remarkably high. In addition, the cryogenic atmosphere and the external circuit are connected by the optical fibers, so that noise such as power source noise can be prevented.

What is claimed is:

1. A magnetometer using a Josephson device, comprising:

a sensor coil which detects a signal magnetic flux a superconducting loop which is magnetically coupled with said sensor coil, to generate a periodic voltage corresponding to the interlinking magnetic flux from said sensor coil, and which is formed of an inductor and at least one Josephson junction;

means to amplify the periodic voltage from said superconducting loop;

electrooptic conversion means to convert the periodic voltage amplified by the amplification means, into a light signal;

synchronous detection means to subject the light signal, per se, from said electrooptic conversion means, to synchronous detection in accordance with a predetermined frequency;

second light transmission means to transmit the light signal from said synchronous detection means;

a superconducting phototransistor which receives the light signal from said second light transmission means and converts it into an electric signal; and a feedback coil which interlinks a magnetic flux corresponding to the electric signal from said superconducting phototransistor, with said superconducting loop;

said sensor coil, said superconducting loop and said superconducting phototransistor means being arranged in a cryogenic atmosphere;

wherein said superconducting loop is formed of the inductor and two Josephson junctions and is biased to a fixed current through a power distribution resistor arranged in the cryogenic atmosphere, a second superconducting loop magnetically coupled with the output of the first-mentioned superconducting loop is interposed between said first-mentioned superconducting loop and said amplification means, and it is formed of an inductor and two Josephson junctions and is biased through a power distribution resistor and a second superconducting phototransistor which are arranged in the cryogenic atmosphere; and said synchronous detection means comprises:

oscillation means to oscillate the predetermined frequency;

light amplification means to receive the light signal from the first light transmission means and to amplify said light signal in synchronism with said predetermined frequency;

directional photocoupling means to receive the light signal from said light amplification means and to divide said light signal into parts in two directions, said directional photocoupling means delivering one of the divided parts of the optical signal as an output signal and delivering the other to said second light transmission means, light emission means connected so as to be driven by said oscillation means, and third light transmission means to transmit a light signal from said light emission means to said second superconducting phototransistor.

* * * * *